(12) United States Patent
Lawrence (10) Patent No.: US 10,914,773 B2
(45) Date of Patent: Feb. 9, 2021

(54) RESOLUTION ADJUSTMENT FOR CAPACITIVE TOUCH SENSOR

(71) Applicant: Intel Corporation, Santa Clara, CA (US)

(72) Inventor: Sean J. Lawrence, Bangalore (IN)

(73) Assignee: Intel Corporation, Santa Clara, CA (US)

(*) Notice: Subject to any disclaimer, the term of this patent is extended or adjusted under 35 U.S.C. 154(b) by 492 days.

(21) Appl. No.: 15/721,652

(22) Filed: Sep. 29, 2017

(65) Prior Publication Data

US 2019/0101578 A1 Apr. 4, 2019

(51) Int. Cl.
| | | |
|---|---|---|
| *G01R 27/26* | (2006.01) | |
| *G06F 3/044* | (2006.01) | |
| *G06F 3/041* | (2006.01) | |
| *G01R 15/16* | (2006.01) | |
| *G01R 19/00* | (2006.01) | |
| *G01R 1/30* | (2006.01) | |
| *G01R 29/08* | (2006.01) | |
| G01R 29/26 | (2006.01) | |
| G01R 15/06 | (2006.01) | |

(52) U.S. Cl.
CPC ........... *G01R 27/2605* (2013.01); *G01R 1/30* (2013.01); *G01R 15/16* (2013.01); *G01R 19/0084* (2013.01); *G01R 27/26* (2013.01); *G01R 29/0814* (2013.01); *G06F 3/044* (2013.01); *G06F 3/0416* (2013.01); *G01R 15/06* (2013.01); *G01R 29/26* (2013.01)

(58) Field of Classification Search
CPC .... G01R 27/2605; G01R 15/16; G01R 27/26; G01R 19/0084; G01R 1/30; G01R 29/0814; G01R 29/26; G01R 15/06
USPC ........... 324/76.11–76.83, 600, 649, 658, 686
See application file for complete search history.

(56) References Cited

U.S. PATENT DOCUMENTS

| | | | |
|---|---|---|---|
| 2008/0158167 A1* | 7/2008 | Hotelling | G06F 3/0416 345/173 |
| 2011/0267312 A1* | 11/2011 | Lin | G06F 3/044 345/174 |
| 2012/0182252 A1* | 7/2012 | Brosnan | G06F 3/044 345/174 |
| 2013/0120260 A1* | 5/2013 | Piot | G06F 3/04883 345/163 |
| 2015/0091859 A1* | 4/2015 | Rosenberg | G06F 3/044 345/174 |
| 2015/0145802 A1* | 5/2015 | Yao | G06F 3/0416 345/174 |
| 2015/0205405 A1* | 7/2015 | Yumoto | G06F 3/044 345/174 |
| 2015/0324062 A1* | 11/2015 | Elias | G06F 3/0418 345/174 |
| 2017/0228062 A1* | 8/2017 | Hristov | G06F 3/0445 |
| 2018/0335873 A1* | 11/2018 | Elias | G06F 3/0446 |

* cited by examiner

*Primary Examiner* — Raul J Rios Russo
(74) *Attorney, Agent, or Firm* — Schiff Hardin LLP (57) ABSTRACT

Technology for adjusting touch resolution for a capacitive touch sensor. A touch resolution of a capacitive touch sensor is set to a first resolution. A footprint of an object in contact with a surface of the capacitive touch sensor is determined. The capacitive touch sensor is adjusted to a second resolution to detect objects based on the footprint of the object, wherein the second resolution is different than the first resolution.

27 Claims, 8 Drawing Sheets

410
A touch resolution of a capacitive touch sensor is set to a first resolution.

420
A footprint of an object in contact with a surface of the capacitive touch sensor is determined.

430
The capacitive touch sensor is adjusted to a second resolution to detect objects based on the footprint of the object, wherein the second resolution is different than the first resolution.

RESOLUTION ADJUSTMENT FOR CAPACITIVE TOUCH SENSOR

BACKGROUND

Capacitive touch sensors are employed in modern devices such as capacitive touch screen technology. For example, a capacitive touch sensor may be found in a tablet computer or a smart phone. One example is projected capacitive touch (P-Cap) that is formed by etching shapes over or into a touch surface. The capacitive touch sensor may have both drive lines and sense lines. In one example, the greater number of drive and sense lines in a given surface area, the greater sensitivity a capacitive touch sensor will have. With an increase in number of drive and sense lines comes an increase in power consumption of the capacitive touch sensor.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

DESCRIPTION OF EMBODIMENTS

Before invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a proximity sensor" includes a plurality of such proximity sensors.

Reference throughout this specification to "an example" means that a particular feature, structure, or characteristic described in connection with the example is included in at least one invention embodiment. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various invention embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood, that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as floppy diskettes, compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. The node and wireless device may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

As used herein, the term "processor" can include general purpose processors, specialized processors such as VLSI, FPGAs, or other types of specialized processors, as well as base band processors used in transceivers to send, receive, and process wireless communications.

It should be understood that many of the functional units described in this specification may have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module may not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in at least one embodiment of the present technology. Thus, appearances of the phrases "in an example" or the word "exemplary" in various places throughout this specification are not necessarily all referring to the same embodiment.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

A capacitive touch sensor or capacitive sense is a technology that is able to detect and measure anything that is conductive or has a dielectric different from the air. The capacitive touch sensor may employ sense lines and drive lines that may be etched over a touch surface. For example, a grid shape may be formed where the drive lines intersect with the sense lines. The touch resolution for a capacitive touch sensor increases as the number of sense and drive lines increases over a given area of the touch surface. As the number of drive lines increase, the power requirements for the capacitive touch sensor increases as well. However, the object that is contacting the capacitive touch sensor to provide input to the system associated with the capacitive touch sensor may not require a high touch resolution. Therefore, the present technology provides solutions for reducing the power requirements and latency for a capacitive touch sensor by adjusting the resolution of a capacitive touch sensor.

For example, a capacitive touch sensor may be set to a first resolution that may be a maximum resolution of the capacitive touch sensor. An object that is intended to provide input for the capacitive touch sensor is placed into contact with a surface of the capacitive touch sensor. The object may be the finger of a user or a stylus interacting with the capacitive touch sensor. A footprint of the object is determined based on the contact with the surface of the capacitive touch sensor. The capacitive touch sensor is then adjusted to a second resolution based on the footprint. The second resolution may be lower than the first resolution and thus may reduce power consumption for the capacitive touch sensor. The second resolution may be achieved by disabling or deactivating a portion of the drive lines in the capacitive touch sensor. This technique may be repeated during the use of the capacitive touch sensor to ensure an optimal resolution.

Figure 1A:
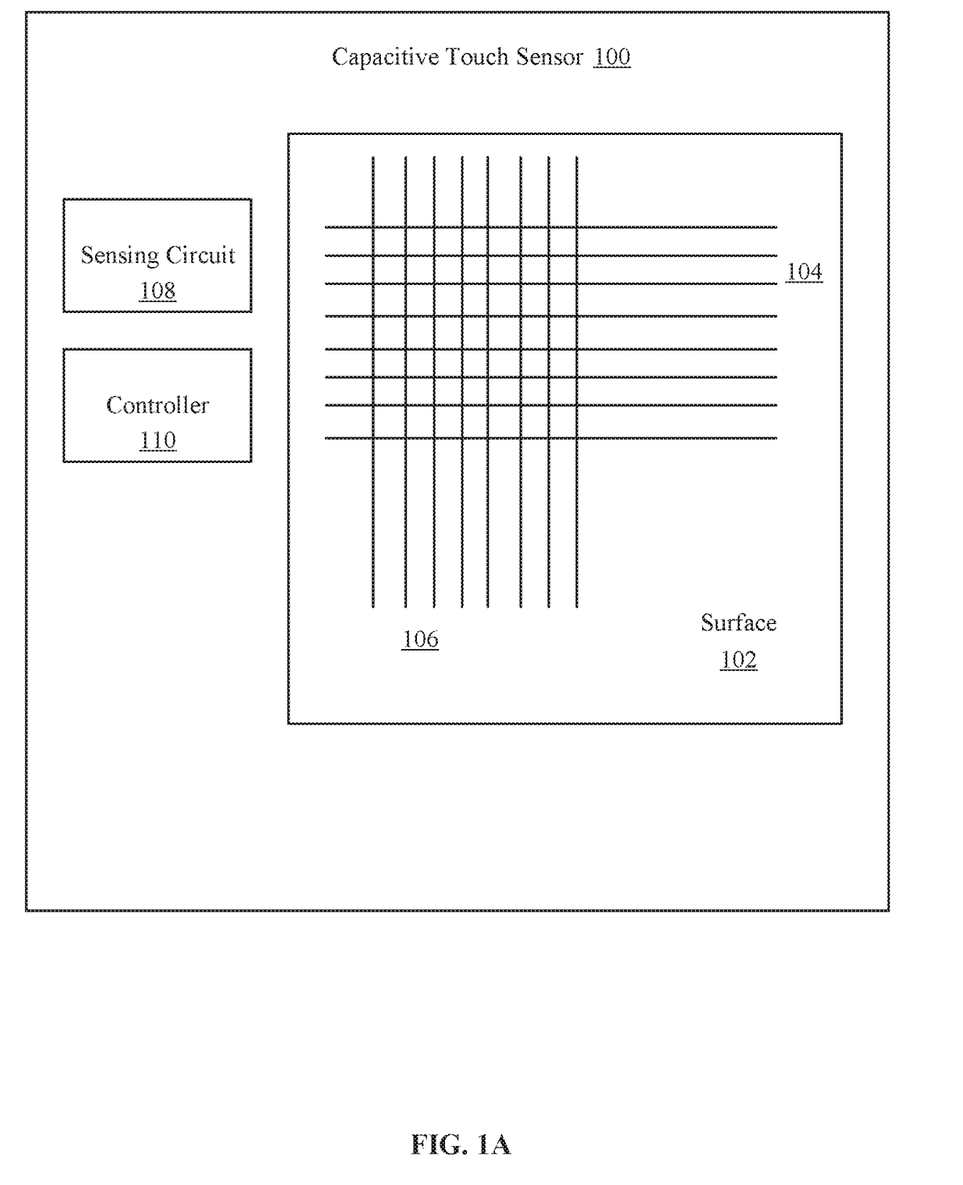
FIG. 1A is a block diagram of a capacitive touch sensor in accordance with an example embodiment.

FIG. 1A is a diagram illustrating an embodiment of a capacitive touch sensor 100 configured to adjust a resolution. The capacitive touch sensor 100 may employ capacitive sensing or capacitance sensing that can detect and measure anything that is conductive or has a dielectric different from air. The capacitive touch sensor 100 may be associated with or coupled with a human interaction device to provide input to a device such as a smart phone, tablet, or other electronic device. An object maybe placed in contact with the capacitive touch sensor 100 to provide input to the device. For example, the object may be a finger or a stylus. A surface 102 of the capacitive touch sensor 100 may be etched with sense lines 104 and drive lines 106. This may be described as projected capacitive touch. The capacitive touch sensor 100 depicts the sense lines 104 and the drive lines 106 in an x-y grid pattern. It should be appreciated that the capacitive touch sensor 100 may comprise lines in any conductive shapes. The touch resolution of the capacitive touch sensor 100 is determined by the density of the sense lines 104 and the drive lines 106 in a given area of the surface 102. For example, the closer the spacing of the sense lines 104 or the drive lines 106 to one another, the higher the touch resolution will be of the capacitive touch sensor 100. The larger the surface 102 is in size, the greater the number of sense lines 104 and drive lines 106 are required to maintain a level of resolution. The surface 102 is depicted with a limited number of the sense lines 104 and the drive lines 106. It should be appreciated that a capacitive touch sensor 100 may have any number of the sense lines 104 and the drive lines 106.

The greater the resolution, or the greater the number of sense lines 104 and the drive lines 106, the greater the power consumption will be for the capacitive touch sensor 100 when active. Additionally, the greater the number of sense lines 104 and the drive lines 106, the latency associated with the capacitive touch sensor 100 increases. The latency increases due to the increased data that is readout from the increased number of the sense lines 104 and the drive lines 106. During operations of the capacitive touch sensor 100, the capacitance of the sense lines 104 is monitored by a sensing circuit 108. The sensing circuit 108 in conjunction with the sense lines 104 is able to detect a change in capacitance such as when an object is placed in contact with the sense lines 104. The controller 110 is capable of activating or deactivating the drive lines 106. For example, the controller 110 may be able to deactivate one drive line, a portion of the drive lines, or all of the drive lines 106. The controller 110 may be able to activate or deactivate the drive lines 106 in a pattern such as deactivating every other drive line, or every third drive line, etc. By deactivating a portion of the drive lines, the resolution of the touchscreen is effected and thereby adjusted. For example, deactivating every other drive line will approximately reduce the resolution by half compared to a resolution with every drive line active. By reducing the resolution of the capacitive touch sensor 100 the power consumption of the capacitive touch sensor 100 reduces. Reduction in power consumption may lead to prolonged battery life for a device employing the capacitive touch sensor 100 with reduced resolution.

The controller 110 may be described as below an operating system executing on a device associated with the capacitive touch sensor 100. The controller 110 may be a hardware device with associated firmware and drivers. In one embodiment, the controller 110 is integrated into a system on a chip for a device associated with the capacitive touch sensor 100. In one embodiment, the controller 110 may be integrated into the capacitive touch sensor 100.

Figure 1B:
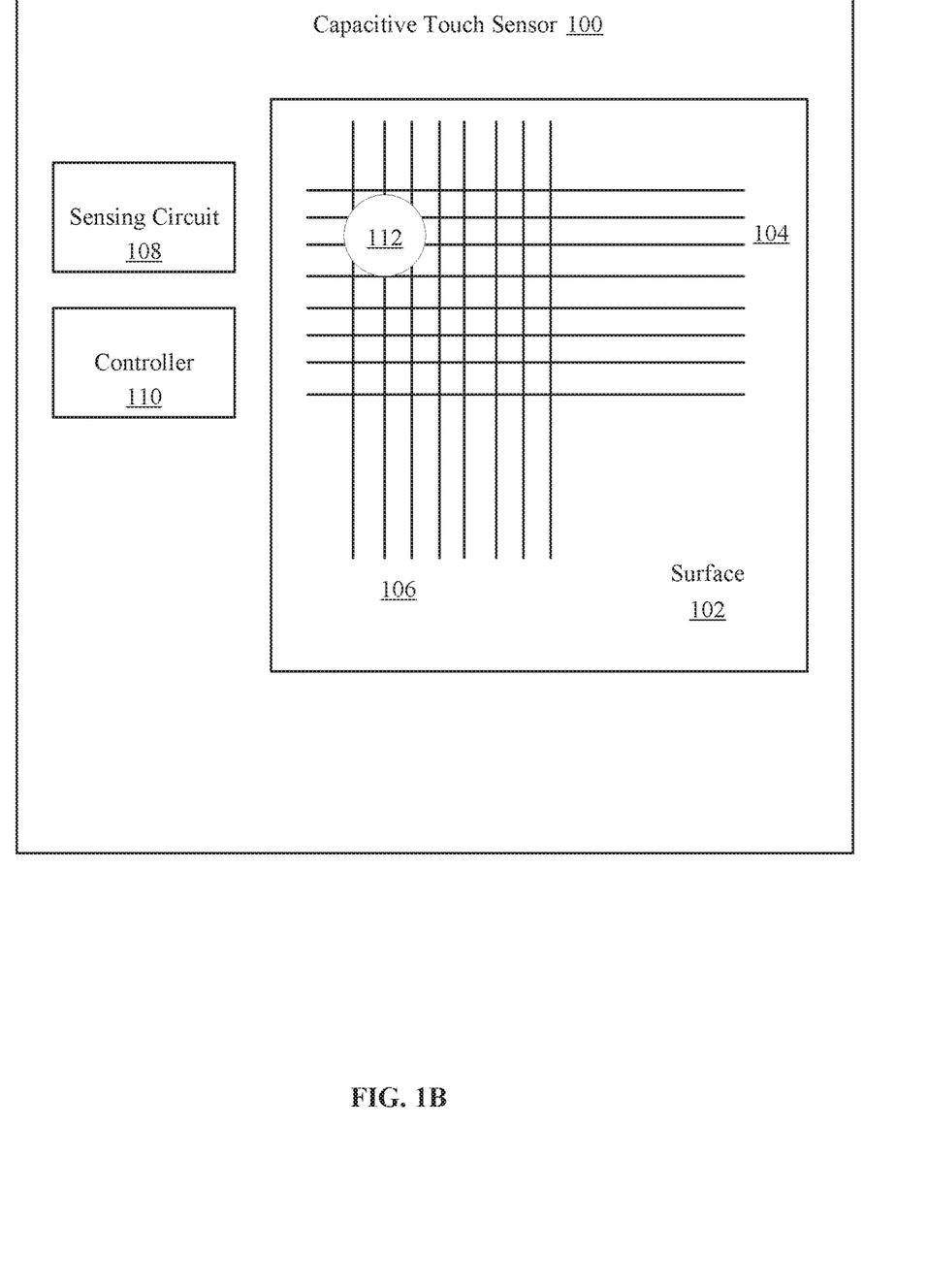
FIG. 1B is a block diagram of a capacitive touch sensor determining a footprint of an object in accordance with an example embodiment.

FIG. 1B is a diagram illustrating an embodiment of a capacitive touch sensor 100 configured to adjust a resolution. The capacitive touch sensor 100 in FIG. 1B is depicted with footprint 112. The footprint 112 represents the footprint made by an object in contact with the surface 102. For example, the object may be a finger of a user or a stylus. The present technology is able to determine a size of the footprint 112. In one embodiment, the controller 110 activates all of the drive lines 106 to ensure that the capacitive touch sensor 100 is set to a first resolution. This may be the maximum resolution possible for the capacitive touch sensor 100. In one embodiment, the first resolution may be less than the maximum resolution. When the object is in contact with the surface 102, the size of the footprint made by the object is determined or measured. The size of the footprint 112 may then be used to determine a second resolution for the capacitive touch sensor 100. The second resolution may be lower compared to the first resolution. If the size of the footprint 112 is greater than the first resolution, such as the maximum resolution, then the first resolution is excessive for the object being used to contact the surface 102. The excessive resolution will consume power that may not be necessary to receive optimal input from the object. Therefore, adjusting or reducing the capacitive touch sensor 100 to a second resolution by deactivating a portion of the drive lines 106 will reduce the power used by the capacitive touch sensor 100 without sacrificing precision touch for an object that produces a footprint that is the size of the footprint 112. Additionally, the capacitive touch sensor 100 will experience a decrease in latency with a portion of the drive lines 106 deactivated because the a reduced number of active drive lines will generate a lower amount of data to be read by the capacitive touch sensor 100.

In one embodiment, the size of the footprint 112 may have a minimum resolution necessary for optimal input by the object associated with the footprint 112. This may be referred to as a resolution requirement of the footprint. The drive lines 106 may provide for a maximum resolution that is more precise than the resolution requirement of the footprint. For example, a capacitive touch sensor 100 may manufactured with drives lines of the surface 102 with a spacing of 4 mm, 0.4 mm or 0.2 mm for precision touch grid lines, or any size of spacing. The size of the footprint produced by the object contacting the surface may be larger than the maximum spacing of the drive lines 106. Fingers of different users may be different sizes and a stylus or other object may be larger or smaller than a finger. The present technology may estimate the size of the object being used to contact the surface 102 to provide input to the capacitive touch sensor 100. This estimate may be made by measuring the size of the footprint 112. For example, if the object contacts the surface 102 and produces the footprint 112, then it is likely that the next time the same object contacts the surface 102 it will produce a footprint of similar size. Thus, the first resolution may be adjusted to a second resolution based on the size of the footprint 112 and the second resolution may be optimized for subsequent contacts of the same object with the surface 102.

In one embodiment, the second resolution or the adjusted resolution may be adjusted so that the spacing between active drive lines is 0.5 mm, 0.8 mm, 3 mm, 4 mm, or any other size of spacing. In one embodiment, after the size of the footprint 112 has been determined, a portion of the drive lines are deactivated such that the second resolution is approximately equal to half the size of the footprint 112. This may be referred to as Nyquist sampling. In one embodiment, the present technology may determine that the size of the footprint 112 has a resolution requirement that is equal to or nearly equal to the maximum resolution possible for the capacitive touch sensor 100. The maximum resolution will then be employed by the capacitive touch sensor 100.

In one embodiment, multiple footprints with different sizes may be detected by multiple objects. In such an embodiment, the resolution may be adjusted to account for the smallest sized footprint. This ensures that the object that produces the smallest footprint will achieve optimal sensitivity during subsequent contacts with the surface 102. The objects that produced the larger footprints will be detected with excessive resolution during subsequent contacts with the capacitive touch sensor 100 set at the second resolution.

Figure 1C:
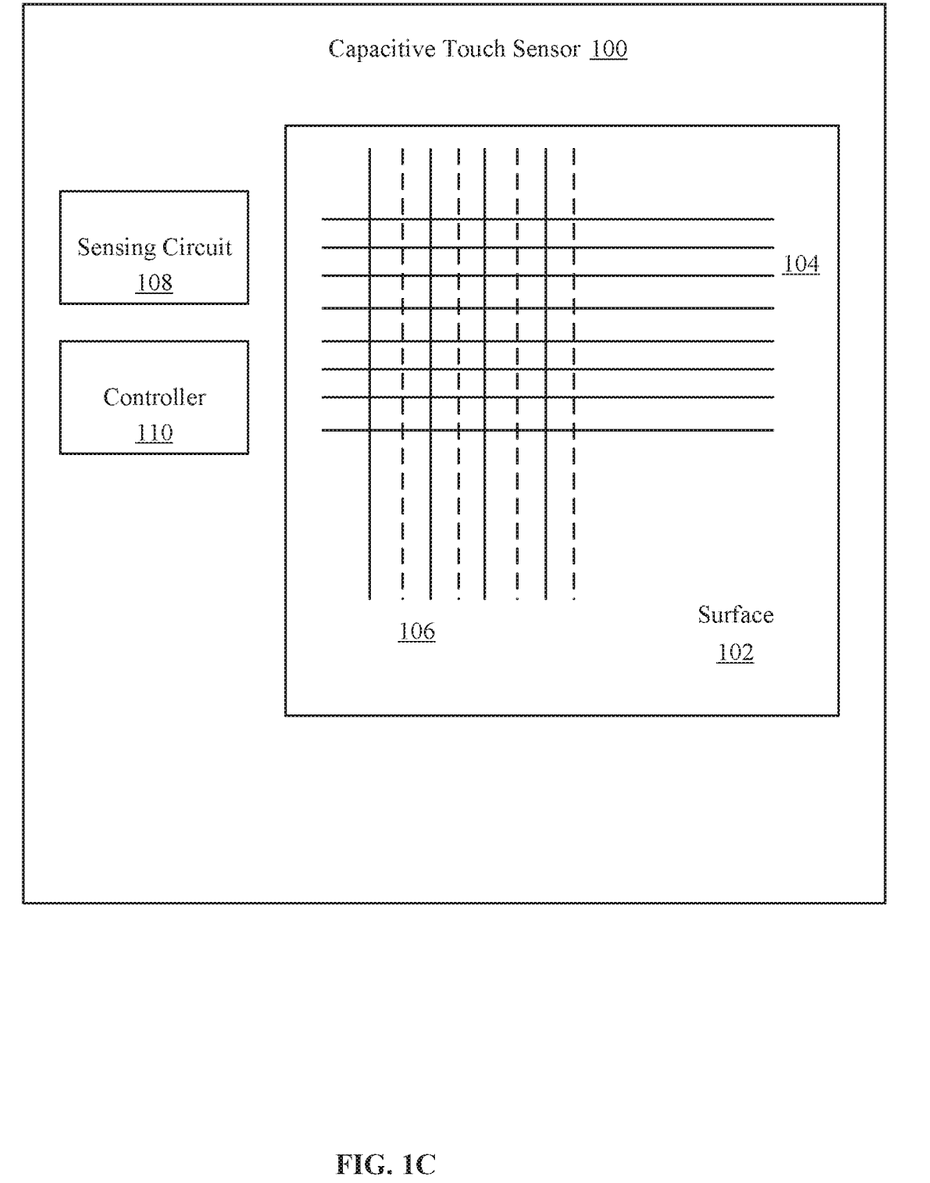
FIG. 1C is a block diagram of a capacitive touch sensor with a portion of the drive lines and the sense lines deactivated in accordance with an example embodiment.

FIG. 1C is a diagram illustrating an embodiment of a capacitive touch sensor 100 with an adjusted resolution. The capacitive touch sensor 100 in FIG. 1B is depicted with a portion of the drive lines 106 deactivated. The deactivated drive lines are depicted with dotted lines while the active drive lines are depicted with solid lines. The deactivated drive lines are depicted as every other drive line. It should be appreciated that any number or pattern of drive lines may be deactivated by the present technology. The process of adjusting a resolution of the capacitive touch sensor 100 based on determining the size of a footprint in contact with the surface 102 may be described as calibration. The calibration may be performed to reduce the capacitive touch sensor 100 from a first or maximum resolution to a second resolution that is lower is in sensitivity because a portion of the drive lines are deactivated. The process or calibration or calibrating the resolution may be performed upon startup of a device associated with the capacitive touch sensor 100. For example, when a device is booted up, the capacitive touch sensor 100 may be set to perform the calibration by setting the resolution to a first resolution or a maximum resolution and then determining the size of the footprint of an object in contact with a surface of the capacitive touch sensor 100. The object may be the first object to contact the capacitive touch sensor 100 during the calibration process.

In one embodiment, the calibration process is repeated periodically during use of the capacitive touch sensor 100. For example, the calibration may be repeated after a predetermined amount of time has passed. The periodic calibration allows the resolution to be adjusted based on the size of the footprint of the object currently being used in conjunction with the capacitive touch sensor 100. For example, a user may begin using a device with her finger but then later switch to using a stylus. The stylus may have a resolution requirement due to the footprint of the stylus that is greater or more sensitive than the resolution requirement due to the footprint of the user's finger. By periodically calibrating the resolution of the capacitive touch sensor 100, the resolution may be adjusted to increase to be more sensitive for the stylus. In one embodiment, the calibration may be performed each time a new application is launched or executed by the device associated with the capacitive touch sensor 100. In one embodiment, the user may initiate a recalibration of the resolution. This may be an option provided to the user in a graphical user interface of the device. In one embodiment, the calibration process takes place while the device is simultaneously executing other processes such as an application for the user and the user is unaware that the calibration is occurring or that the resolution has been adjusted to a lower resolution.

In one embodiment, the size of the footprint 112 may have a minimum resolution necessary for optimal input by the object associated with the footprint 112. This may be referred to as a resolution requirement of the footprint. The drive lines 106 may provide for a maximum resolution that is more precise than the resolution requirement of the footprint. For example, a capacitive touch sensor 100 may be manufactured with drives lines of the surface 102 with a spacing of 4 mm, 0.4 mm or 0.2 mm for precision touch grid lines, or any size of spacing. The size of the footprint produced by the object contacting the surface may be larger than the maximum spacing of the drive lines 106. Fingers of different users may be different sizes and a stylus or other object may be larger or smaller than a finger. The present technology may estimate the size of the object being used to contact the surface 102 to provide input to the capacitive touch sensor 100. This estimate may be made by measuring the size of the footprint 112. For example, if the object contacts the surface 102 and produces the footprint 112, then it is likely that the next time the same object contacts the surface 102 it will produce a footprint of similar size. Thus, the first resolution may be adjusted to a second resolution based on the size of the footprint 112 and the second resolution may be optimized for subsequent contacts of the same object with the surface 102.

Figure 2:
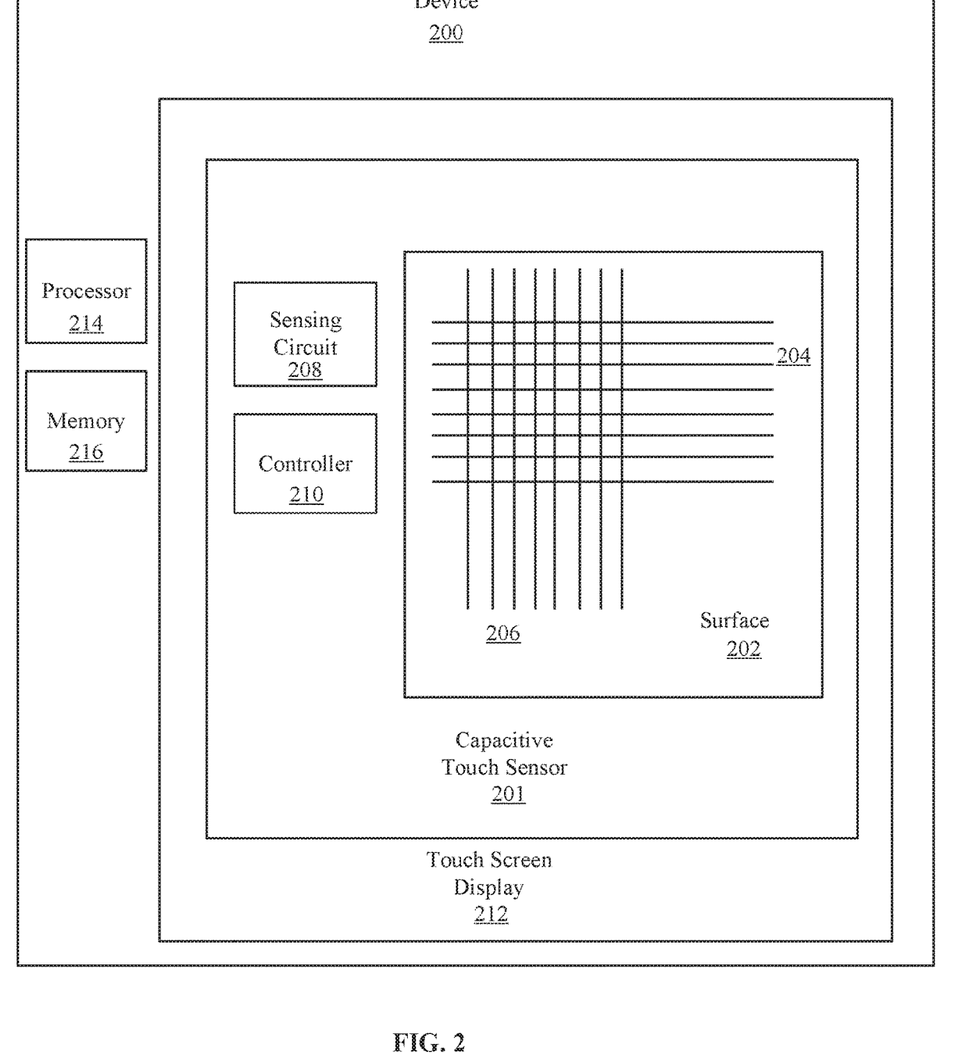
FIG. 2 is a block diagram of a device with a capacitive touch sensor in accordance with an example embodiment.

FIG. 2 is a diagram illustrating an embodiment of a device 200 with a capacitive touch sensor 201 configured to adjust a resolution. The device 200 may be any type of electronic device associated with a capacitive touch sensor 201. The capacitive touch sensor 201, the surface 202, the sense lines 204, the drive lines 206, the sensing circuit 208, and the controller 210 may have features and capabilities similar to their respective components found in FIGS. 1A-1C. The device 200 may have a touch screen display 212 that may overlay or be integrated with the capacitive touch sensor 201. The device 200 may also comprise a processor 214 and a memory 216 that are configured to process and store data. The drive lines 206 are depicted as each being activated. However, the capacitive touch sensor 201 is capable of employing the controller 210 to deactivate a portion of the drive lines 206 to reduce the resolution of the capacitive touch sensor 201.

Figure 3:
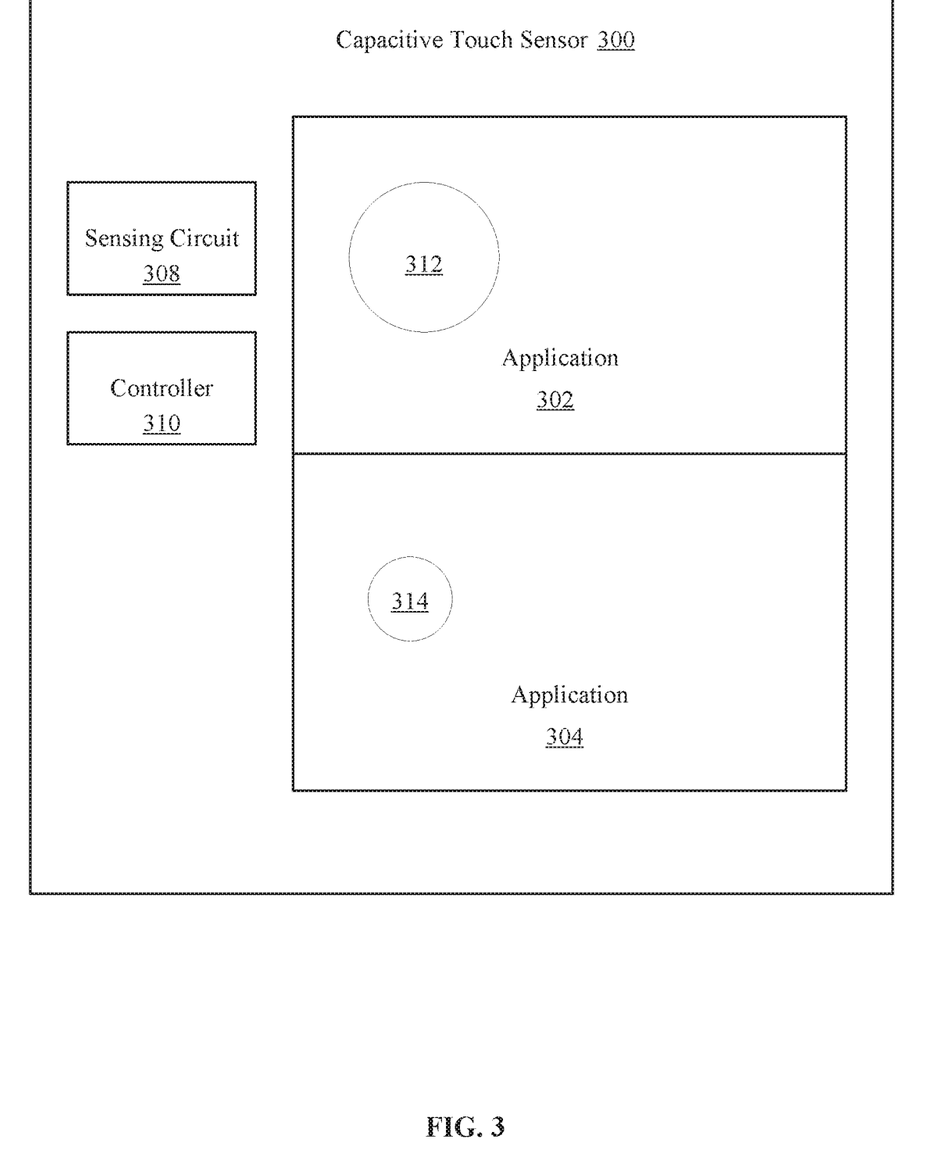
FIG. 3 is a block diagram of capacitive touch sensor executing a plurality of applications in accordance with an example embodiment.

FIG. 3 is a diagram of capacitive touch sensor executing a plurality of applications. The capacitive touch sensor 300 may have features and capabilities similar to the capacitive touch sensor 100 found in FIGS. 1A-1C. The sensing circuit 308 and the controller 310 may have features and capabilities similar to their respective components found in FIGS. 1A-1C. The capacitive touch sensor 300 may be configured to display application 302 and application 304 which are each application executing on a device associated with the capacitive touch sensor 300. For example, the application 302 may be a web browser and the application 304 may be a virtual keyboard. The application 302 may receive contact or interaction with an object that leaves a footprint 312. The application 304 may receive contact or interaction with an object that leaves a footprint 314. The size of the footprint 312 may be bigger than the size of the footprint 314. This may be due to a user employing a finger with application 302 and a stylus with application 304 or may be due to different users with different size fingers using different portions of the capacitive touch sensor 300. In one embodiment, the resolution of the capacitive touch sensor 300 may be adjusted such that different portions of the surface of the capacitive touch sensor 300 are adjusted to different resolutions. For example, the portion of the surface of the capacitive touch sensor 300 associated with the application 302 may be adjusted to a resolution that is lower than a resolution set for the portion of the surface associated with application 304.

In one embodiment, the application 302 may have a resolution requirement that is different than a resolution requirement for the application 304. The portion of the capacitive touch sensor 300 associated with the application 302 may then be adjusted to a different resolution than the portion of the capacitive touch sensor 300 associated with the application 304. Each portion of the capacitive touch sensor 300 may be set based on a resolution requirement of an application, a determination of a footprint of an object in contact with the surface of the capacitive touch sensor 300, or both.

In one embodiment, different portions of the capacitive touch sensor 300 may be calibrated to different resolutions within the same applications. For example, an application may have different interfaces such as one interface for drawing and another with predefined buttons to adjust settings within the application and another interface with a virtual keyboard. Each region or interface within the application may have different resolution requirement. The present technology may operate to calibrate or set a different resolution for each of the different regions. This may be based on footprint size of objects contacting the different region, the resolution requirement of each region, or both.

Figure 4:
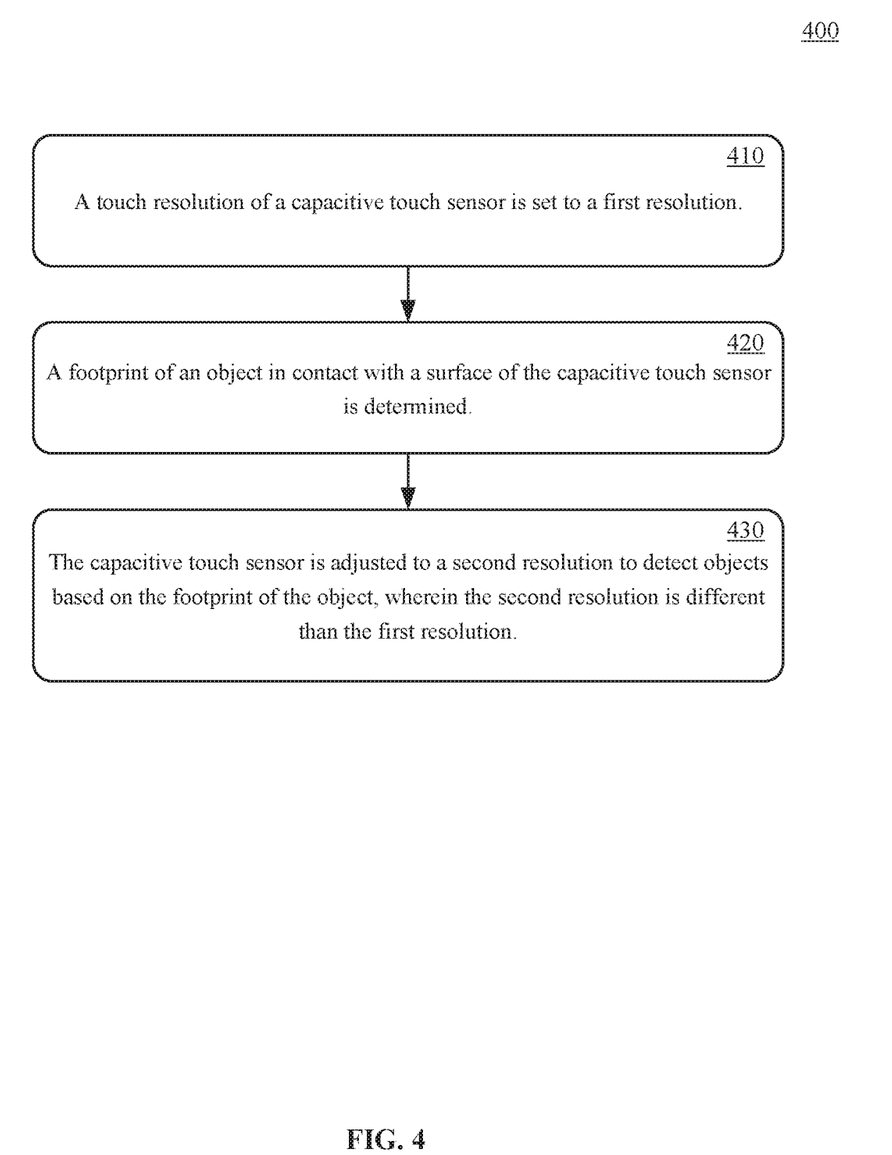
FIGS. 4-5 are flow diagrams of methods for adjusting touch resolution for a capacitive touch sensor in accordance with an example embodiment.

FIG. 4 depicts a flowchart of process 400 of a method for adjusting touch resolution for a capacitive touch sensor. The method can be executed as instructions on a machine, where the instructions are included on at least one computer readable medium or one non-transitory machine-readable storage medium. In one embodiment, the capacitive touch sensor 100 of FIGS. 1A-1C or any other device or system recited herein, is configured to carry out the steps process 400. Moreover, the devices and components depicted in FIGS. 1A-1C, 2, 3, and 6 may be employed to carry out the steps of process 400. The method can include the operation of: a touch resolution of a capacitive touch sensor is set to a first resolution, as in block 410. The method can include the operation of: a footprint of an object in contact with a surface of the capacitive touch sensor is determined, as in block 420. The method can include the operation of: the capacitive touch sensor is adjusted to a second resolution to detect objects based on the footprint of the object, wherein the second resolution is different than the first resolution, as in block 430. It should be appreciated that the steps of process 400 may not include all of the steps depicted nor in the order in which they are depicted.

Figure 5:
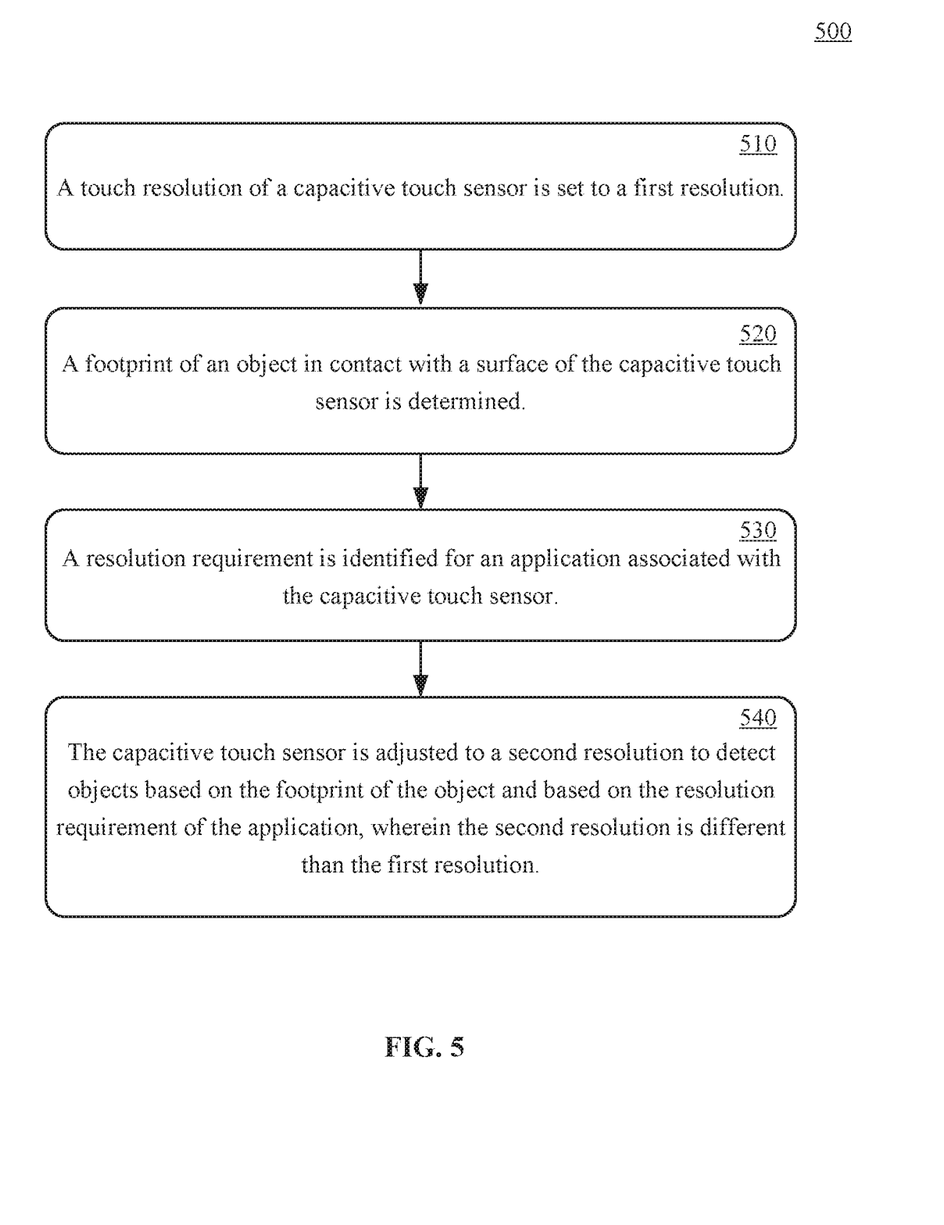

FIG. 5 depicts a flowchart of process 500 of a method for adjusting touch resolution for a capacitive touch sensor. The method can be executed as instructions on a machine, where the instructions are included on at least one computer readable medium or one non-transitory machine-readable storage medium. In one embodiment, the capacitive touch sensor 100 of FIGS. 1A-1C or any other device or system recited herein, is configured to carry out the steps process 500. Moreover, the devices and components depicted in FIGS. 1A-1C, 2, 3, and 6 may be employed to carry out the steps of process 500. The method can include the operation of: a touch resolution of a capacitive touch sensor is set to a first resolution, as in block 510. The method can include the operation of: a footprint of an object in contact with a surface of the capacitive touch sensor is determined, as in block 520. The method can include the operation of: a resolution requirement is identified for an application associated with the capacitive touch sensor, as in block 530. The method can include the operation of: the capacitive touch sensor is adjusted to a second resolution to detect objects based on the footprint of the object and based on the resolution requirement of the application, wherein the second resolution is different than the first resolution, as in block 540. It should be appreciated that the steps of process 500 may not include all of the steps depicted nor in the order in which they are depicted.

Figure 6:
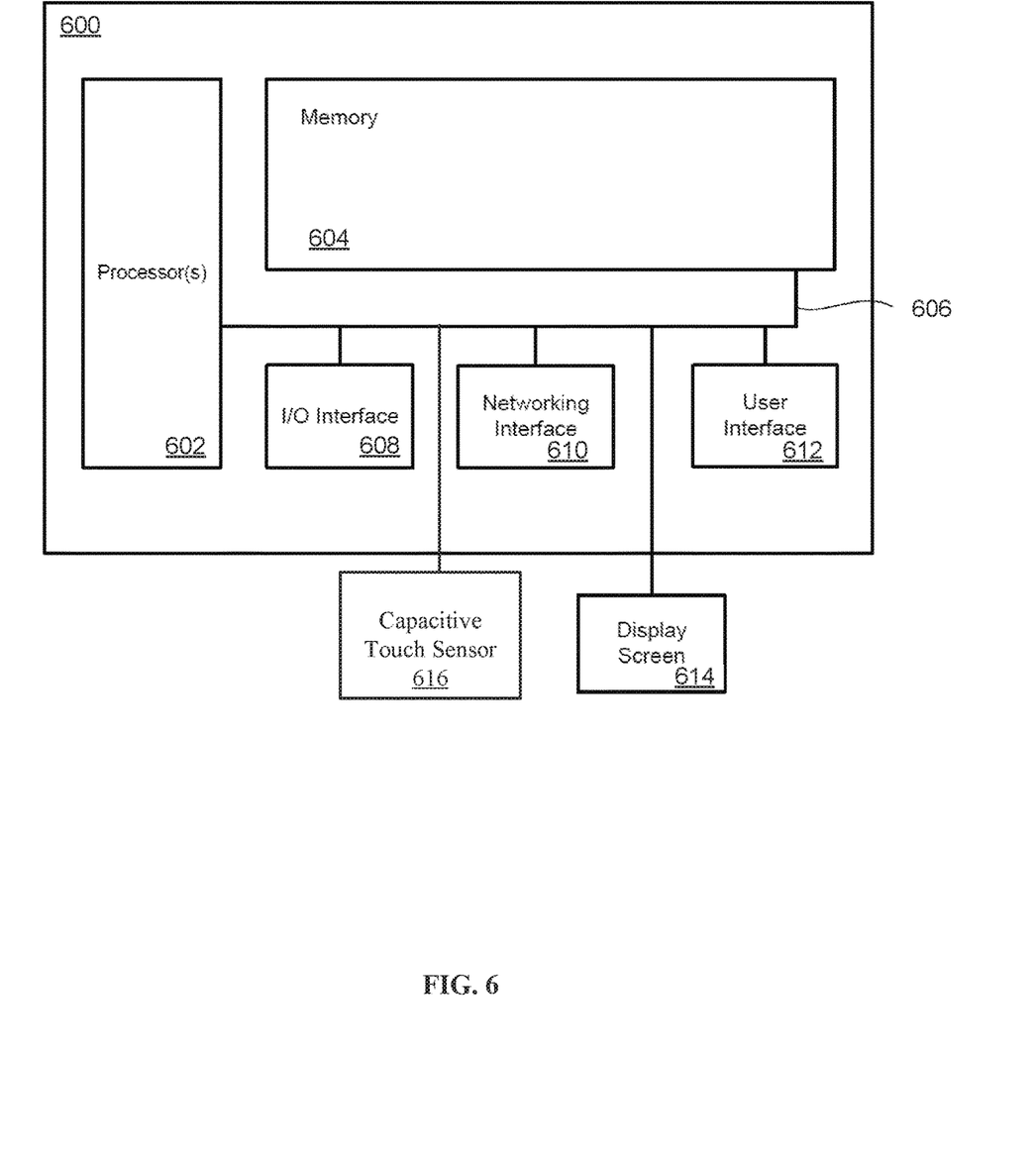
FIG. 6 is a block diagram of an example computer system with a capacitive touch sensor in accordance with another example embodiment.

FIG. 6 depicts an exemplary system upon which embodiments of the present disclosure may be implemented. For example, the system of FIG. 6 may be a computer system or virtual reality device. The system can include a memory controller 602, a plurality of memory 604, a processor 606, and circuitry 608. The circuitry can be configured to implement the hardware described herein for virtual reality device 100 of FIG. 1 or as otherwise recited herein. Various embodiments of such systems for FIG. 6 can include smart phones, laptop computers, handheld and tablet devices, CPU systems, SoC systems, server systems, networking systems, storage systems, high capacity memory systems, or any other computational system.

The system can also include an I/O (input/output) interface 610 for controlling the I/O functions of the system, as well as for I/O connectivity to devices outside of the system. A network interface can also be included for network connectivity, either as a separate interface or as part of the I/O interface 610. The network interface can control network communications both within the system and outside of the system. The network interface can include a wired interface, a wireless interface, a Bluetooth interface, optical interface, and the like, including appropriate combinations thereof. Furthermore, the system can additionally include various user interfaces, display devices, as well as various other components that would be beneficial for such a system.

The system can also include memory in addition to memory 604 that can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The processor 606 can be a single or multiple processors, and the memory can be a single or multiple memories. The local communication interface can be used as a pathway to facilitate communication between any of a single processor, multiple processors, a single memory, multiple memories, the various interfaces, and the like, in any useful combination.

The system can also include a user interface 612 a graphical user interface for interacting with the user. The system can also include a display screen 614 for displaying images and the user interface 612. The display screen 614 may be a touch screen. The system can also include a capacitive touch sensor 616 for detecting objects. The capacitive touch sensor 614 may be integrated with the display screen 614.

The disclosed embodiments may be implemented, in some cases, in hardware, firmware, software, or any combination thereof. Portions of the disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

EXAMPLES

The following examples pertain to specific technology embodiments and point out specific features, elements, or steps that may be used or otherwise combined in achieving such embodiments.

In one example there is provided, a method for adjusting touch resolution for a capacitive touch sensor, including setting a touch resolution of a capacitive touch sensor to a first resolution;

determining a footprint of an object in contact with a surface of the capacitive touch sensor; and adjusting the capacitive touch sensor to a second resolution to detect objects based on the footprint of the object, wherein the second resolution is different than the first resolution.

In one example of a method for adjusting touch resolution for a capacitive touch sensor, the first resolution is a maximum resolution of the capacitive touch sensor with all drive lines of the capacitive touch sensor activated.

In one example of a method for adjusting touch resolution for a capacitive touch sensor, the second resolution is achieved by deactivating a portion of drive lines of the capacitive touch sensor.

In one example of a method for adjusting touch resolution for a capacitive touch sensor further comprises, identifying a resolution requirement for an application associated with the capacitive touch sensor; and the adjusting the capacitive touch sensor to the second resolution is based on the footprint of the object and based on the resolution requirement of the application.

In one example of a method for adjusting touch resolution for a capacitive touch sensor, if the resolution requirement of the application is lower than a resolution requirement of the footprint, then the second resolution is set to the resolution requirement of the application.

In one example of a method for adjusting touch resolution for a capacitive touch sensor, if the resolution requirement of the application is higher than a resolution requirement of the footprint, then the second resolution is set to the resolution requirement of the footprint.

In one example of a method for adjusting touch resolution for a capacitive touch sensor, the object in contact with the surface of the capacitive touch sensor is a finger of a user.

In one example of a method for adjusting touch resolution for a capacitive touch sensor, the object in contact with the surface of the capacitive touch sensor is a stylus.

In one example of a method for adjusting touch resolution for a capacitive touch sensor, multiple objects are in contact with the surface of the capacitive touch sensor and the second resolution is set to a resolution associated with an object of the multiple objects that has the highest resolution.

In one example of a method for adjusting touch resolution for a capacitive touch sensor, multiple applications are associated with the capacitive touch sensor each with a different resolution requirement and the second resolution is set to a resolution associated application that has the highest resolution requirement.

In one example of a method for adjusting touch resolution for a capacitive touch sensor, the method is executed upon startup of a device associated with the capacitive touch sensor.

In one example of a method for adjusting touch resolution for a capacitive touch sensor, the method is repeated periodically during use of the capacitive touch sensor to readjust the second resolution.

In one example of a method for adjusting touch resolution for a capacitive touch sensor, the method is executed upon startup of an application associated with the capacitive touch sensor.

In one example of a method for adjusting touch resolution for a capacitive touch sensor, the method is executed simultaneous to a user employing the capacitive touch sensor.

In one example of a method for adjusting touch resolution for a capacitive touch sensor, a first portion of the surface is adjusted to the second resolution and a second portion of the surface is adjusted to a third resolution.

In one example of a method for adjusting touch resolution for a capacitive touch sensor, the first resolution is 0.4 mm of spacing between active drive lines of the capacitive touch sensor.

In one example of a method for adjusting touch resolution for a capacitive touch sensor, the first resolution is 0.2 mm of spacing between active drive lines of the capacitive touch sensor.

In one example of a method for adjusting touch resolution for a capacitive touch sensor, the second resolution is 0.5 mm of spacing between active drive lines of the capacitive touch sensor.

In one example of a method for adjusting touch resolution for a capacitive touch sensor, the second resolution is 0.8 mm of spacing between active drive lines of the capacitive touch sensor.

In one example of a method for adjusting touch resolution for a capacitive touch sensor, the second resolution is 3 mm of spacing between active drive lines of the capacitive touch sensor.

In one example of a method for adjusting touch resolution for a capacitive touch sensor, the second resolution is 4 mm of spacing between active drive lines of the capacitive touch sensor.

In one example there is provided, a method for adjusting touch resolution for a capacitive touch sensor, including
setting a touch resolution of a capacitive touch sensor to a first resolution;
determining a footprint of an object in contact with a surface of the capacitive touch sensor;
identifying a resolution requirement for an application associated with the capacitive touch sensor; and
adjusting the capacitive touch sensor to a second resolution to detect objects based on the footprint of the object and based on the resolution requirement of the application, wherein the second resolution is different than the first resolution.

In one example of a method for adjusting touch resolution for a capacitive touch sensor, the first resolution is a maximum resolution of the capacitive touch sensor with all drive lines of the capacitive touch sensor activated.

In one example of a method for adjusting touch resolution for a capacitive touch sensor, the second resolution is achieved by deactivating a portion of drive lines of the capacitive touch sensor.

In one example of a method for adjusting touch resolution for a capacitive touch sensor, if the resolution requirement of the application is lower than a resolution requirement of the footprint, then the second resolution is set to the resolution requirement of the application.

In one example of a method for adjusting touch resolution for a capacitive touch sensor, if the resolution requirement of the application is higher than a resolution requirement of the footprint, then the second resolution is set to the resolution requirement of the footprint.

In one example of a method for adjusting touch resolution for a capacitive touch sensor, the object in contact with the surface of the capacitive touch sensor is a finger of a user.

In one example of a method for adjusting touch resolution for a capacitive touch sensor, the object in contact with the surface of the capacitive touch sensor is a stylus.

In one example of a method for adjusting touch resolution for a capacitive touch sensor, multiple objects are in contact with the surface of the capacitive touch sensor and the second resolution is set to a resolution associated with an object of the multiple objects that has the highest resolution.

In one example of a method for adjusting touch resolution for a capacitive touch sensor, multiple applications are associated with the capacitive touch sensor each with a different resolution requirement and the second resolution is set to a resolution associated application that has the highest resolution requirement.

In one example of a method for adjusting touch resolution for a capacitive touch sensor, the method is executed upon startup of a device associated with the capacitive touch sensor.

In one example of a method for adjusting touch resolution for a capacitive touch sensor, the method is repeated periodically during use of the capacitive touch sensor to readjust the second resolution.

In one example of a method for adjusting touch resolution for a capacitive touch sensor, the method is executed upon startup of the application associated with the capacitive touch sensor.

In one example of a method for adjusting touch resolution for a capacitive touch sensor, the method is executed simultaneous to a user employing the capacitive touch sensor.

In one example of a method for adjusting touch resolution for a capacitive touch sensor, a first portion of the surface is adjusted to the second resolution and a second portion of the surface is adjusted to a third resolution.

In one example of a method for adjusting touch resolution for a capacitive touch sensor, the first resolution is 0.4 mm of spacing between active drive lines of the capacitive touch sensor.

In one example of a method for adjusting touch resolution for a capacitive touch sensor, the first resolution is 0.2 mm of spacing between active drive lines of the capacitive touch sensor.

In one example of a method for adjusting touch resolution for a capacitive touch sensor, the second resolution is 0.5 mm of spacing between active drive lines of the capacitive touch sensor.

In one example of a method for adjusting touch resolution for a capacitive touch sensor, the second resolution is 0.8 mm of spacing between active drive lines of the capacitive In one example of a method for adjusting touch resolution for a capacitive touch sensor, the second resolution is 3 mm of spacing between active drive lines of the capacitive touch sensor.

In one example of a method for adjusting touch resolution for a capacitive touch sensor, the second resolution is 4 mm of spacing between active drive lines of the capacitive touch sensor.

In one example there is provided, a capacitive touch sensor system, including
a plurality of drive lines configured to carry an electrical current;
a plurality of sense lines configured to carry an electrical current and intersect with the plurality of drive lines;
a sensing circuit configured to monitor the capacitance of the sense lines; and
a controller configured to:
enable the plurality of drive lines to a first resolution;
determine a footprint of an object in contact with a surface of the capacitive touch sensor system based on a change in capacitance detected by the sensing circuit; and
adjust the first resolution to a second resolution to detect objects based on the footprint of the object by disabling a portion of the plurality of drive lines, wherein the second resolution is different than the first resolution.

In one example of a capacitive touch sensor system, the first resolution is a maximum resolution of the capacitive touch sensor system with all of the plurality of drive lines activated.

In one example of a capacitive touch sensor system, the second resolution is achieved by deactivating a portion of the plurality of drive lines.

In one example of a capacitive touch sensor system, the controller is further configured to:
identify a resolution requirement for an application associated with the capacitive touch sensor system; and
the capacitive touch sensor system is adjusted to the second resolution based on the footprint of the object and based on the resolution requirement of the application.

In one example of a capacitive touch sensor system, if the resolution requirement of the application is lower than a resolution requirement of the footprint, then the second resolution is set to the resolution requirement of the application.

In one example of a capacitive touch sensor system, if the resolution requirement of the application is higher than a resolution requirement of the footprint, then the second resolution is set to the resolution requirement of the footprint.

In one example of a capacitive touch sensor system, the object in contact with the surface of the capacitive touch sensor system is a finger of a user.

In one example of a capacitive touch sensor system, the object in contact with the surface of the capacitive touch sensor system is a stylus.

In one example of a capacitive touch sensor system, multiple objects are in contact with the surface of the capacitive touch sensor system and the second resolution is set to a resolution associated with an object of the multiple objects that has the highest resolution.

In one example of a capacitive touch sensor system, multiple applications are associated with the capacitive touch sensor system each with a different resolution requirement and the second resolution is set to a resolution associated application that has the highest resolution requirement.

In one example of a capacitive touch sensor system, the controller operates to adjust to the second resolution upon startup of the capacitive touch sensor system.

In one example of a capacitive touch sensor system, the controller operates to adjust a resolution of the capacitive touch sensor system repeatedly on a periodic basis during use of the capacitive touch sensor system.

In one example of a capacitive touch sensor system, the controller operates to adjust to the second resolution upon startup of an application associated the capacitive touch sensor system.

In one example of a capacitive touch sensor system, a first portion of the surface is adjusted to the second resolution and a second portion of the surface is adjusted to a third resolution.

In one example of a capacitive touch sensor system, the first resolution is 0.4 mm of spacing between active drive lines of the plurality of drive lines.

In one example of a capacitive touch sensor system, the first resolution is 0.2 mm of spacing between active drive lines of the plurality of drive lines.

In one example of a capacitive touch sensor system, the second resolution is 0.5 mm of spacing between active drive lines of plurality of drive lines.

In one example of a capacitive touch sensor system, the second resolution is 0.8 mm of spacing between active drive lines of the plurality of drive lines.

In one example of a capacitive touch sensor system, the second resolution is 3 mm of spacing between active drive lines of the capacitive touch sensor.

In one example of a capacitive touch sensor system, the second resolution is 4 mm of spacing between active drive lines of the capacitive touch sensor.

In one example there is provided, a device with a capacitive touch sensor, including
a processor and memory;
a touch screen display configured to display images and receive input from a user;
a capacitive touch sensor comprising:
a plurality of drive lines configured to carry an electrical current;
a plurality of sense lines configured to carry an electrical current and intersect with the plurality of drive lines; and
a sensing circuit configured to monitor the capacitance of the sense lines;
a controller configured to:
enable the plurality of drive lines to a first resolution;
determine a footprint of an object in contact with the touch screen display based on a change in capacitance detected by the sensing circuit;
adjust the first resolution to a second resolution to detect objects based on the footprint of the object by disabling a portion of the plurality of drive lines, wherein the second resolution is different than the first resolution.

In one example of a device with a capacitive touch sensor, the first resolution is a maximum resolution of the capacitive touch sensor with all of the plurality of drive lines activated.

In one example of a device with a capacitive touch sensor, the second resolution is achieved by deactivating a portion of the plurality of drive lines.

In one example of a device with a capacitive touch sensor, the controller is further configured to:
identify a resolution requirement for an application associated with the capacitive touch sensor; and the capacitive touch sensor is adjusted to the second resolution based on the footprint of the object and based on the resolution requirement of the application.

In one example of a device with a capacitive touch sensor, if the resolution requirement of the application is lower than a resolution requirement of the footprint, then the second resolution is set to the resolution requirement of the application.

In one example of a device with a capacitive touch sensor, if the resolution requirement of the application is higher than a resolution requirement of the footprint, then the second resolution is set to the resolution requirement of the footprint.

In one example of a device with a capacitive touch sensor, the object in contact with the surface of the capacitive touch sensor is a finger of a user.

In one example of a device with a capacitive touch sensor, the object in contact with the surface of the capacitive touch sensor is a stylus.

In one example of a device with a capacitive touch sensor, multiple objects are in contact with the surface of the capacitive touch sensor and the second resolution is set to a resolution associated with an object of the multiple objects that has the highest resolution.

In one example of a device with a capacitive touch sensor, multiple applications are associated with the capacitive touch sensor each with a different resolution requirement and the second resolution is set to a resolution associated application that has the highest resolution requirement.

In one example of a device with a capacitive touch sensor, the controller operates to adjust to the second resolution upon startup of the capacitive touch sensor.

In one example of a device with a capacitive touch sensor, the controller operates to adjust a resolution of the capacitive touch sensor system repeatedly on a periodic basis during use of the capacitive touch sensor.

In one example of a device with a capacitive touch sensor, the controller operates to adjust to the second resolution upon startup of an application associated the capacitive touch sensor.

In one example of a device with a capacitive touch sensor, a first portion of the surface is adjusted to the second resolution and a second portion of the surface is adjusted to a third resolution.

In one example of a device with a capacitive touch sensor, the first resolution is 0.4 mm of spacing between active drive lines of the plurality of drive lines.

In one example of a device with a capacitive touch sensor, the first resolution is 0.2 mm of spacing between active drive lines of the plurality of drive lines.

In one example of a device with a capacitive touch sensor, the second resolution is 0.5 mm of spacing between active drive lines of plurality of drive lines.

In one example of a device with a capacitive touch sensor, the second resolution is 0.8 mm of spacing between active drive lines of the plurality of drive lines.

In one example of a device with a capacitive touch sensor, the second resolution is 3 mm of spacing between active drive lines of the capacitive touch sensor.

In one example of a device with a capacitive touch sensor, the second resolution is 4 mm of spacing between active drive lines of the capacitive touch sensor.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. A capacitive touch sensor system, comprising:
    a plurality of drive lines configured to carry an electrical current;
    a plurality of sense lines configured to carry an electrical current and intersect with the plurality of drive lines;
    a sensing circuit configured to monitor the capacitance of the sense lines; and
    a controller configured to:
        enable the plurality of drive lines to a first resolution;
        determine a footprint of an object in contact with a surface of the capacitive touch sensor system based on a change in capacitance detected by the sensing circuit; and
        adjust the first resolution to a second resolution to detect objects based on the footprint of the object by disabling a portion of the plurality of drive lines,
    wherein the second resolution is different than the first resolution.

2. The capacitive touch sensor system as recited in claim 1, wherein the first resolution is a maximum resolution of the capacitive touch sensor system with all of the plurality of drive lines enabled.

3. The capacitive touch sensor system as recited in claim 1, wherein the controller is further configured to:
    identify a resolution requirement for an application associated with the capacitive touch sensor system; and
    adjust the capacitive touch sensor system to the second resolution based on the footprint of the object and based on the resolution requirement of the application.

4. The capacitive touch sensor system as recited in claim 3,
    wherein the controller is configured to, if the resolution requirement of the application is lower than a resolution requirement of the footprint, adjust the first resolution to the second resolution by setting the second resolution to the resolution requirement of the application.

5. The capacitive touch sensor system as recited in claim 3,
    wherein the controller is configured to, if the resolution requirement of the application is higher than a resolution requirement of the footprint, adjust the first resolution to the second resolution by setting the second resolution to the resolution requirement of the footprint.

6. The capacitive touch sensor system as recited in claim 1, wherein the object in contact with the surface of the capacitive touch sensor system is a finger of a user.

7. The capacitive touch sensor system as recited in claim 1, wherein the object in contact with the surface of the capacitive touch sensor system is a stylus.

8. The capacitive touch sensor system as recited in claim 1, wherein multiple objects are in contact with the surface of the capacitive touch sensor system, and
    wherein the controller is configured to adjust the first resolution to the second resolution by setting the second resolution to a resolution associated with an object of the multiple objects having the smallest sized footprint.

9. The capacitive touch sensor system as recited in claim 1, wherein multiple applications are associated with the capacitive touch sensor system each with a different resolution requirement, and wherein the controller is configured to adjust the first resolution to the second resolution by setting the second resolution to that of an application from among the multiple applications that has the highest resolution requirement.

10. The capacitive touch sensor system as recited in claim 1, wherein the controller is configured to adjust to the second resolution upon startup of the capacitive touch sensor system.

11. The capacitive touch sensor system as recited in claim 1, wherein the controller is configured to adjust a resolution of the capacitive touch sensor system repeatedly on a periodic basis during use of the capacitive touch sensor system.

12. The capacitive touch sensor system as recited in claim 1, wherein the controller is configured to adjust to the first resolution to the second resolution upon startup of an application associated the capacitive touch sensor system.

13. The capacitive touch sensor system as recited in claim 1, wherein the controller is configured to adjust a resolution of a first portion of the surface to the second resolution and to adjust a resolution of a second portion of the surface to a third resolution.

14. A method for adjusting touch resolution for a capacitive touch sensor, comprising:
   setting a touch resolution of a capacitive touch sensor to a first resolution by enabling a plurality of drive lines associated with the capacitive touch sensor;
   monitoring a capacitance of a plurality of sense lines associated with the capacitive touch sensor to determine a footprint of an object in contact with a surface of the capacitive touch sensor; and
   adjusting the touch resolution of the capacitive touch sensor from the first resolution to a second resolution to subsequently detect objects based on the determined footprint of the object,
   wherein the adjustment of the touch resolution from the first resolution to the second resolution is performed by disabling a portion of the drive lines associated with the capacitive touch sensor, and
   wherein the second resolution is different than the first resolution.

15. The method as recited in claim 14, wherein the first resolution is a maximum resolution of the capacitive touch sensor with all drive lines of the capacitive touch sensor enabled.

16. The method as recited in claim 14, further comprising:
   identifying a resolution requirement for an application associated with the capacitive touch sensor; and
   wherein the act of adjusting the capacitive touch sensor from the first resolution to the second resolution comprises adjusting the capacitive touch sensor to the second resolution based on the footprint of the object and based on the resolution requirement of the application.

17. The method as recited in claim 16, wherein if the resolution requirement of the application is lower than a resolution requirement of the footprint, the act of adjusting the capacitive touch sensor from the first resolution to the second resolution comprises setting the second resolution to the resolution requirement of the application.

18. The method as recited in claim 16, wherein if the resolution requirement of the application is higher than a resolution requirement of the footprint, the act of adjusting the capacitive touch sensor from the first resolution to the second resolution comprises adjusting the capacitive touch sensor to the resolution requirement of the footprint.

19. The method as recited in claim 14, wherein the object in contact with the surface of the capacitive touch sensor is a finger of a user.

20. The method as recited in claim 14, wherein the object in contact with the surface of the capacitive touch sensor is a stylus.

21. The method as recited in claim 14, wherein multiple objects are in contact with the surface of the capacitive touch sensor, and
   wherein the act of adjusting the capacitive touch sensor to the second resolution comprises setting the second resolution to a resolution associated with an object of the multiple objects having the smallest sized footprint.

22. The method as recited in claim 14, wherein multiple applications are associated with the capacitive touch sensor each with a different resolution requirement, and
   wherein the act of adjusting the capacitive touch sensor from the first resolution to the second resolution comprises setting the second resolution to that of an application from among the multiple applications that has the highest resolution requirement.

23. The method as recited in claim 14, wherein the method is executed upon startup of a device associated with the capacitive touch sensor.

24. The method as recited in claim 14, wherein the method is repeated periodically during use of the capacitive touch sensor to readjust the second resolution.

25. The method as recited in claim 14, wherein the method is executed upon startup of an application associated with the capacitive touch sensor.

26. The method as recited in claim 14, wherein the method is executed to simultaneously with a user employing the capacitive touch sensor.

27. The method as recited in claim 14, wherein the act of adjusting the capacitive touch sensor from the first resolution to the second resolution comprises adjusting a resolution of a first portion of the surface to the second resolution and further comprising adjusting a resolution of a second portion of the surface to a third resolution.

* * * * *